(12) United States Patent
Sennett et al.

(10) Patent No.: US 11,533,033 B2
(45) Date of Patent: Dec. 20, 2022

(54) AUDIO SIGNAL AMPLIFIER GAIN CONTROL

(71) Applicant: Bose Corporation, Framingham, MA (US)

(72) Inventors: Brian Sennett, Cambridge, MA (US); Robert John Currie, Framingham, MA (US); Christopher J. Perkins, Shrewsbury, MA (US); Thomas S. Daly, Northborough, MA (US); Craig Small, Framingham, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

(21) Appl. No.: 17/116,105

(22) Filed: Dec. 9, 2020

(65) Prior Publication Data

US 2021/0391839 A1 Dec. 16, 2021

Related U.S. Application Data

(60) Provisional application No. 63/038,713, filed on Jun. 12, 2020.

(51) Int. Cl.
*H03G 3/00* (2006.01)
*H03G 3/30* (2006.01)
*G06F 3/16* (2006.01)
*H04R 3/00* (2006.01)
*H03F 3/183* (2006.01)
*G06F 3/04817* (2022.01)

(52) U.S. Cl.
CPC ....... *H03G 3/3005* (2013.01); *G06F 3/04817* (2013.01); *G06F 3/165* (2013.01); *H03F 3/183* (2013.01); *H04R 3/00* (2013.01); *H03F 2200/03* (2013.01); *H03G 2201/103* (2013.01); *H04R 2430/01* (2013.01)

(58) Field of Classification Search
CPC ....................................................... H03G 3/00
See application file for complete search history.

(56) References Cited

U.S. PATENT DOCUMENTS

| | | | | |
|---|---|---|---|---|
| 5,524,060 A | * | 6/1996 | Silfvast | H03G 3/00 381/104 |
| 5,677,962 A | * | 10/1997 | Harrison | H03G 3/001 330/278 |
| 5,740,260 A | * | 4/1998 | Odom | H04H 60/04 381/103 |
| 5,959,610 A | * | 9/1999 | Silfvast | H01H 19/00 345/156 |

(Continued)

FOREIGN PATENT DOCUMENTS

EP 2485395 A1 8/2012

OTHER PUBLICATIONS

The International Search Report and the Written Opinion of the International Searching Authority dated Oct. 25, 2021 for PCT Application No. PCT/US2021/037135.

*Primary Examiner* — Olisa Anwah
(74) *Attorney, Agent, or Firm* — Bose Corporation

(57) ABSTRACT

A system for controlling the gain of an input signal in an audio signal amplifier. The system includes a user-operable gain control, and analog and digital circuit elements that together are configured to modify the gain of the input signal in response to the user-operable gain control.

17 Claims, 6 Drawing Sheets

(56) References Cited

U.S. PATENT DOCUMENTS

| | | | | |
|---|---|---|---|---|
| 6,370,502 B1* | 4/2002 | Wu | ............... | G10L 19/028 |
| | | | | 704/E19.02 |
| 8,433,077 B2* | 4/2013 | Suezawa | ............ | H03G 3/345 |
| | | | | 704/226 |
| 10,048,667 B1* | 8/2018 | Vinyard | ............ | H04H 60/04 |
| 10,587,983 B1* | 3/2020 | Meyer | ............ | H03G 9/18 |
| 2003/0069049 A1* | 4/2003 | Poranen | ............ | H03F 3/24 |
| | | | | 455/572 |
| 2006/0232586 A1* | 10/2006 | Terada | ............ | G06T 11/206 |
| | | | | 345/440 |
| 2007/0137466 A1* | 6/2007 | Lindemann | ............ | G10H 1/0066 |
| | | | | 84/626 |
| 2008/0056511 A1* | 3/2008 | Zhang | ............ | G10L 19/005 |
| | | | | 381/94.4 |
| 2009/0083031 A1* | 3/2009 | Atlas | ............ | G10L 21/02 |
| | | | | 704/219 |
| 2012/0328126 A1* | 12/2012 | Sakai | ............ | H03G 3/3005 |
| | | | | 381/107 |
| 2014/0033900 A1* | 2/2014 | Chapman | ............ | G10H 1/0083 |
| | | | | 84/609 |
| 2014/0044268 A1* | 2/2014 | Herberger | ............ | H03G 3/20 |
| | | | | 381/104 |
| 2015/0008962 A1* | 1/2015 | Blyth | ............ | H03F 3/68 |
| | | | | 327/59 |
| 2015/0332660 A1* | 11/2015 | Adams | ............ | G10H 3/18 |
| | | | | 84/645 |
| 2016/0139788 A1* | 5/2016 | Nishikori | ............ | G06F 3/04847 |
| | | | | 715/716 |
| 2019/0180725 A1* | 6/2019 | Gause | ............ | G10H 1/057 |
| 2020/0036352 A1* | 1/2020 | Zhu | ............ | H03G 3/3005 |
| 2021/0091739 A1* | 3/2021 | Matamura | ............ | H03G 3/3005 |

\* cited by examiner

AUDIO SIGNAL AMPLIFIER GAIN CONTROL

CROSS-REFERENCE TO RELATED APPLICATION

This application claims priority to Provisional Patent Application 63/038,713 filed on Jun. 12, 2020.

BACKGROUND

This disclosure relates to controlling the gain in an audio signal.

Audio amplifiers that are designed to be used by both consumers and professionals can have input channels that need to handle a very wide range of input levels. The input level range can be beyond the input range of the analog-digital converter (ADC) that precedes the digital signal processor (DSP) in the product. This input level mismatch is often dealt with by including a separate gain control, or a Mic/Line level switch, preceding the channel's level or volume control. These allow the user to control electronic gain and divide the input level range of the ADC into smaller segments. The normal level or volume control then controls the digital gain in the DSP. However, this approach requires the user to recognize that the input level range may be too high and then operate an additional control. These actions may be confusing and unintuitive. Also, if the controls are used improperly, the resulting signal quality can be poor. Another approach to this problem is to provide a single analog control that causes multiple analog gain stages to work together. However, this type of control is not configured to be driven remotely by a mobile application, and so its usefulness is limited.

SUMMARY

All examples and features mentioned below can be combined in any technically possible way.

In one aspect a system for controlling the gain of an input signal in an audio signal amplifier includes a user-operable gain control, at least one analog circuit element, and at least one digital circuit element. The analog and digital circuit elements together are configured to modify the gain of the input signal in response to the user-operable gain control.

Some examples include one of the above and/or below features, or any combination thereof. In some examples the at least one analog circuit element comprises an analog pre-amplifier that defines a plurality of first gain steps that each accomplish different gains on an audio signal. In an example the at least one digital circuit element comprises a digital signal processor (DSP), downstream of the pre-amplifier, that is configured to define a plurality of second compensation gain steps that accomplish different gains on the audio signal, to compensate for the pre-amplifier gain. In an example the DSP is further configured to apply a system gain in addition to the compensation gain. In an example the first gain steps and the second compensation gain steps are each discrete changes in gain. In an example the second compensation gain steps are the opposite of the first gain steps. In an example an overall gain accomplished by the first gain steps and the second compensation gain steps together, is constant.

Some examples include one of the above and/or below features, or any combination thereof. In an example the user-operable gain control is a continuous control. In some examples the user-operable gain control comprises a physical control member and a virtual control member, wherein the physical and virtual control members have matching appearances. In an example the physical control member comprises a control knob and the virtual control member comprises a knob icon. In an example the at least one analog circuit element is configured to reduce the gain of the input signal upon detection of a high input signal level. In an example the at least one digital circuit element is configured to detect the high input signal level and select the gain reduction accomplished by the at least one analog circuit element.

Some examples include one of the above and/or below features, or any combination thereof. In an example the at least one digital circuit element is further configured to compensate for a time delay between a gain change request and the actual change in amplitude of audio data. In some examples the at least one digital circuit element is further configured to remove and replace signal discontinuities in an output signal. In an example the at least one digital circuit element is configured to remove and replace signal discontinuities by zeroing digital data that includes the discontinuity. In an example the at least one digital circuit element is further configured to remove and replace signal discontinuities by reconstructing the zeroed digital data from surrounding data. In an example the at least one digital circuit element is configured to remove and replace signal discontinuities by reconstructing digital data at the signal discontinuities from surrounding data. In an example the modification of the gain of the input signal is under control of the at least one digital circuit element. In an example an overall gain applied by both the at least one analog circuit element and the at least one digital circuit element together matches a target gain from the user-operable gain control.

In another aspect a system for controlling the gain of an input signal in an audio signal amplifier includes a user-operable gain control, an analog pre-amplifier that defines a plurality of first discrete gain steps that each accomplish different gains on an audio signal, and a digital signal processor (DSP), downstream of the pre-amplifier, that is configured to define a plurality of second discrete compensation gain steps that are the opposite of the first gain steps, to compensate for the pre-amplifier gain. The DSP is further configured to apply a system gain in addition to the compensation gain. The analog and digital circuit elements together are configured to modify the gain of the input signal in response to the user-operable gain control. An overall gain accomplished by the first gain steps and the second compensation gain steps together is constant.

Some examples include one of the above and/or below features, or any combination thereof. In an example the at least one analog pre-amplifier is further configured to reduce the gain of the input signal upon detection of a high input signal level, the DSP is further configured to detect the high input signal level and select the gain reduction accomplished by the pre-amplifier, and the DSP is further configured to remove and replace signal discontinuities in an output signal by reconstructing digital data at the signal discontinuities from surrounding data.

DETAILED DESCRIPTION

The audio signal amplifier gain control is configured to control signal level over a wide range of input levels and with good signal-to-noise ratio (SNR), with only a single physical or virtual user-operated control per channel.

Figure 1:
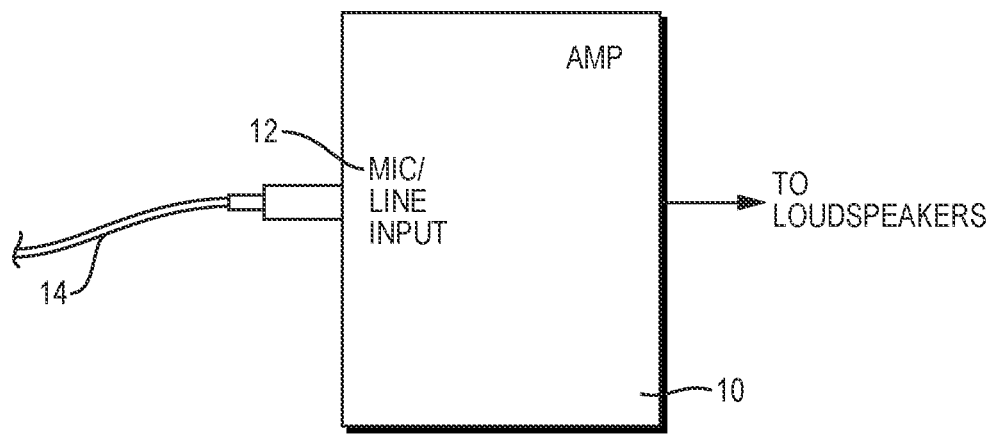
FIG. 1 is a schematic diagram of an audio signal amplifier.

FIG. 1 illustrates audio signal amplifier 10 that is configured to accomplish the subject gain control. Exemplary input 14 is coupled to the mic/line input connector 12. The amplifier signal is outputted to the loudspeakers. In some examples, input 14 comes from a musical instrument (e.g., an electric guitar) being played, and amplifier 10 is configured to amplify the input and provide it to loudspeakers that are used to broadcast the music in a venue such as a concert hall.

Figure 2A:
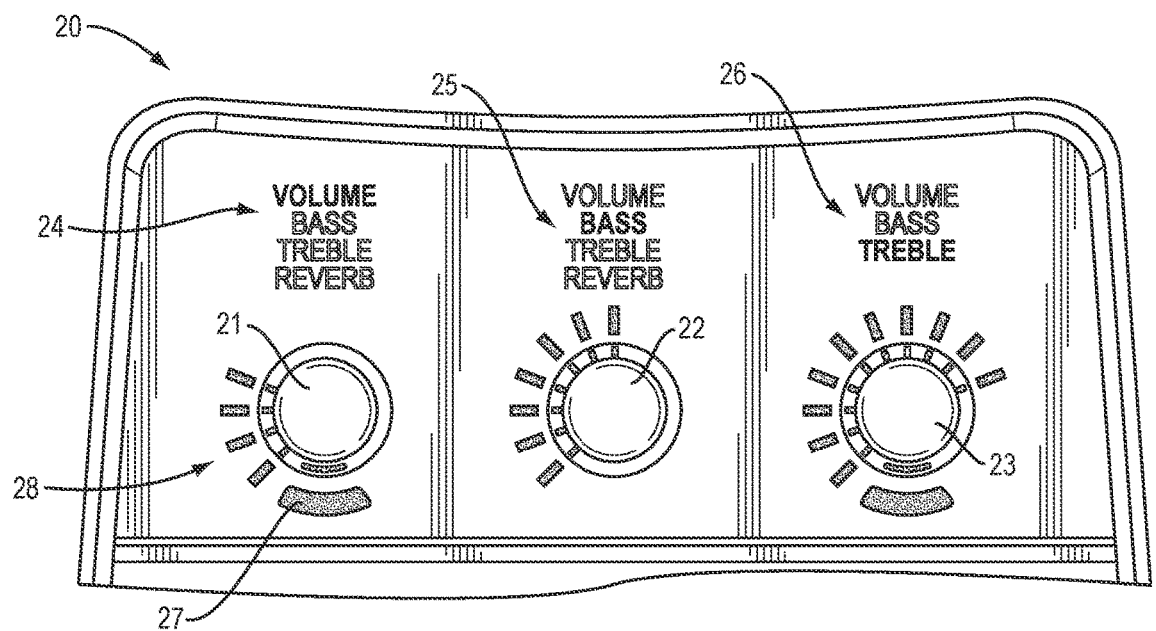
FIG. 2A illustrates a physical control panel of an audio signal amplifier.
Figure 2B:
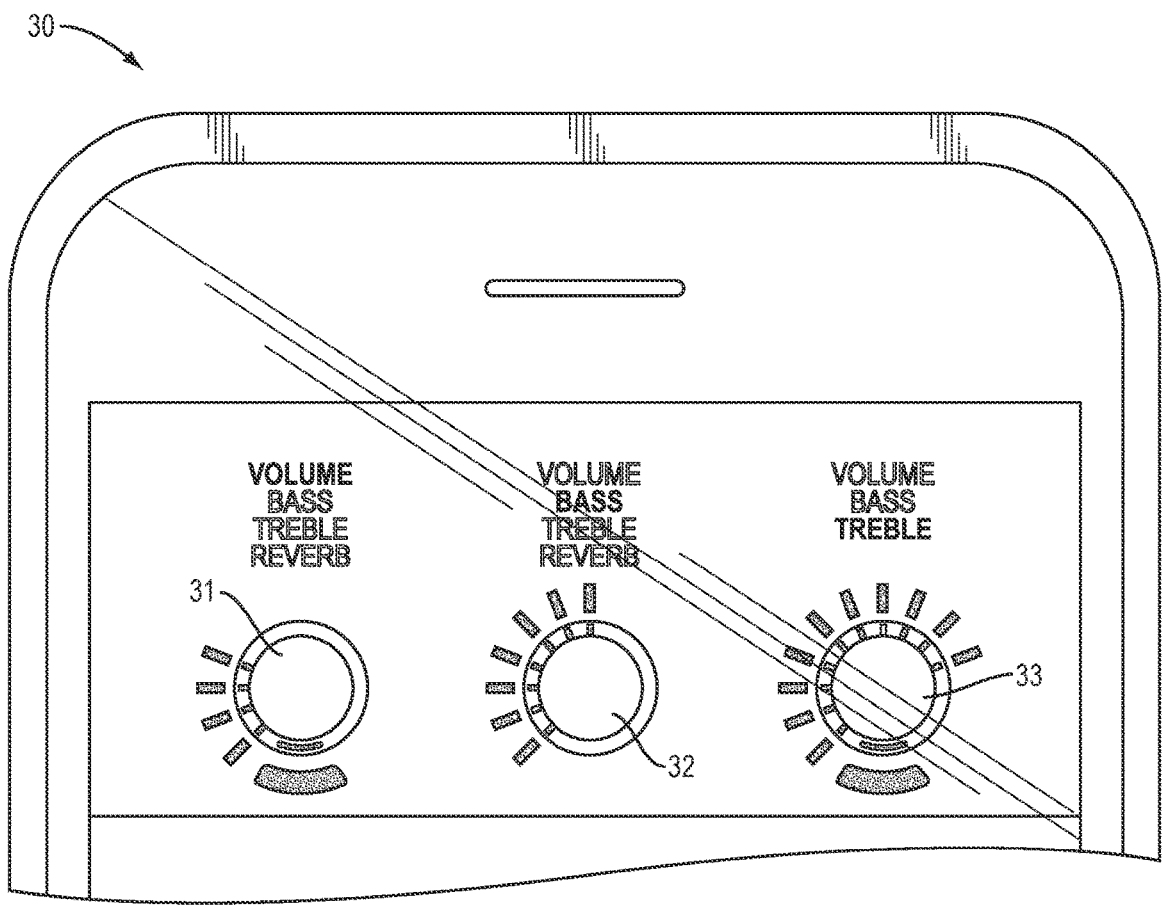
FIG. 2B illustrates a virtual control set of the user interface (UI) of an audio signal amplifier control application.

Exemplary control interfaces for an amplifier are shown in FIGS. 2A and 2B. In some examples the user-operable control interface of the amplifier comprises one or more physical knobs, typically one per input channel. In some examples the level control is additionally or alternatively accomplished with one or more virtual knobs, typically one per input channel, and that can be part of the UI of a mobile app used to interface with and control the amplifier. In each case the knob(s) preferably include an indication of the selected level, such as with indicator lights (e.g., LEDs) that are arranged along the perimeter of the physical or virtual knob and are selectively lit as an indication of the knob position between 0 and 100. For example, if the knob is set to 40%, the first 40% of the lights starting at 0 and moving toward 100 are lit. In some examples control types other than knobs are used, such as sliders.

In an example the physical and virtual controls are similar in appearance, and operate similarly. In some examples if the physical knob is moved (e.g., turned or pushed) a control system causes the appropriate function, on/off, and level indicators of the virtual knob to operate/move in the same manner such that the physical and virtual controls operate and indicate in unison. For example, in some examples if the virtual knob is turned up or down the level indicators associated with the physical knob are changed in the same manner.

FIG. 2A illustrates an exemplary physical control panel 20 with knobs used to select and control three input channels. In some examples two of the three input channels handle a very wide range of input levels, where the range is beyond the input range of an analog to digital converter that precedes a digital signal processor of the amplifier. One, two, or all three of the knobs 21, 22, and 23 may be used to select between two or more functions, such as volume, treble, bass, and reverb functions. In the non-limiting illustrated example, knobs 21 and 22 can each be used to select one of the volume, treble, bass, and reverb functions (via function sets 24 and 25 associated with the knobs, respectively), while knob 23 can be used to select one of volume, treble, and bass functions (via function set 26 associated with the knob). In an example selection is made by rotating the knob until the selected function is lit and then pressing the knob to enable (turn on) the function. The level is then selected by turning the knob, with a series of radial LEDs (such as set 28 for knob 21) used to indicate the selected level. A separate light 27 may be used to indicate if the knob is in current use (i.e., it has been pushed to turn it on), as depicted with knobs 21 and 23.

FIG. 2B illustrates an identical control set 30 to that of FIG. 2A, but in a digital display (such as the display of a smartphone). Virtual knobs 31-33 can be operated in the same manner as physical knobs 21-23 but using the functions of a touch-sensitive display or otherwise (e.g., with a touch replacing a knob push or the turning of a knob).

Figure 3:
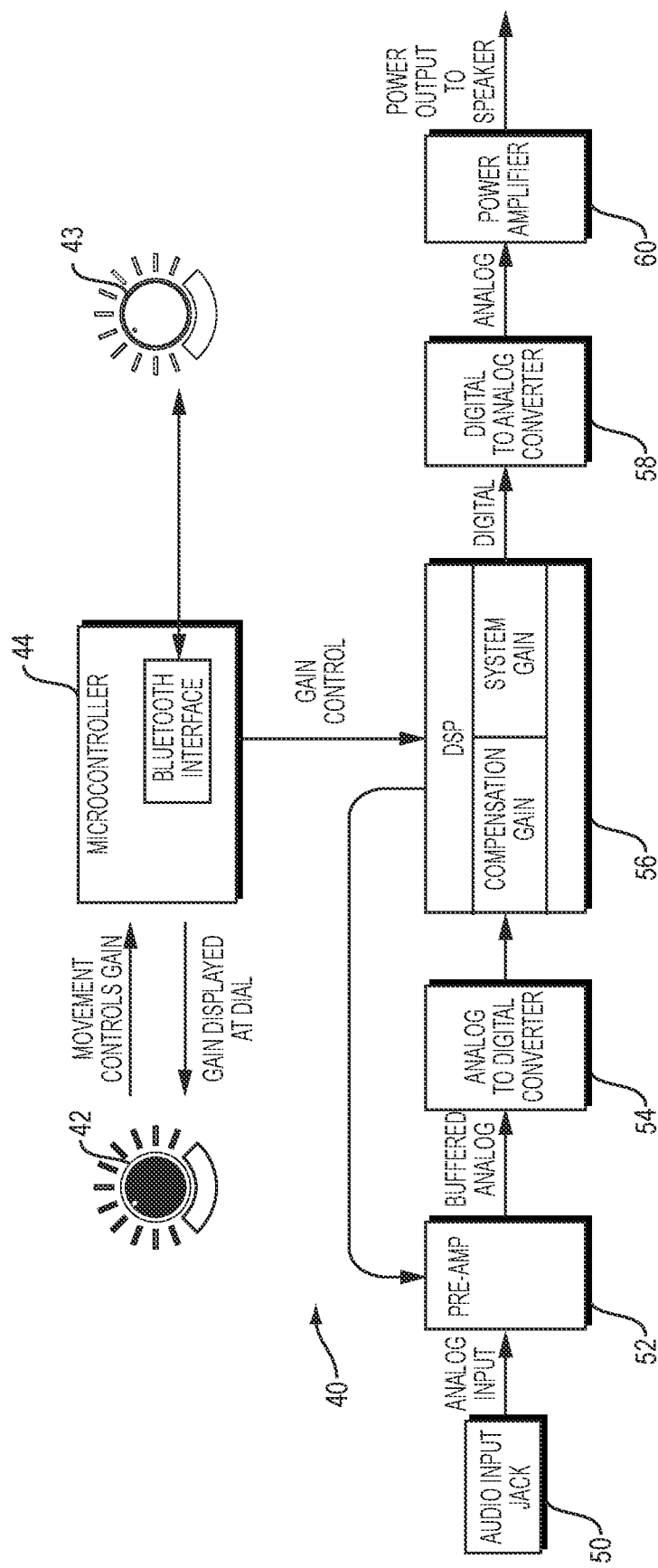
FIG. 3 is a block diagram of functional aspects of an audio signal amplifier.
Figure 4:
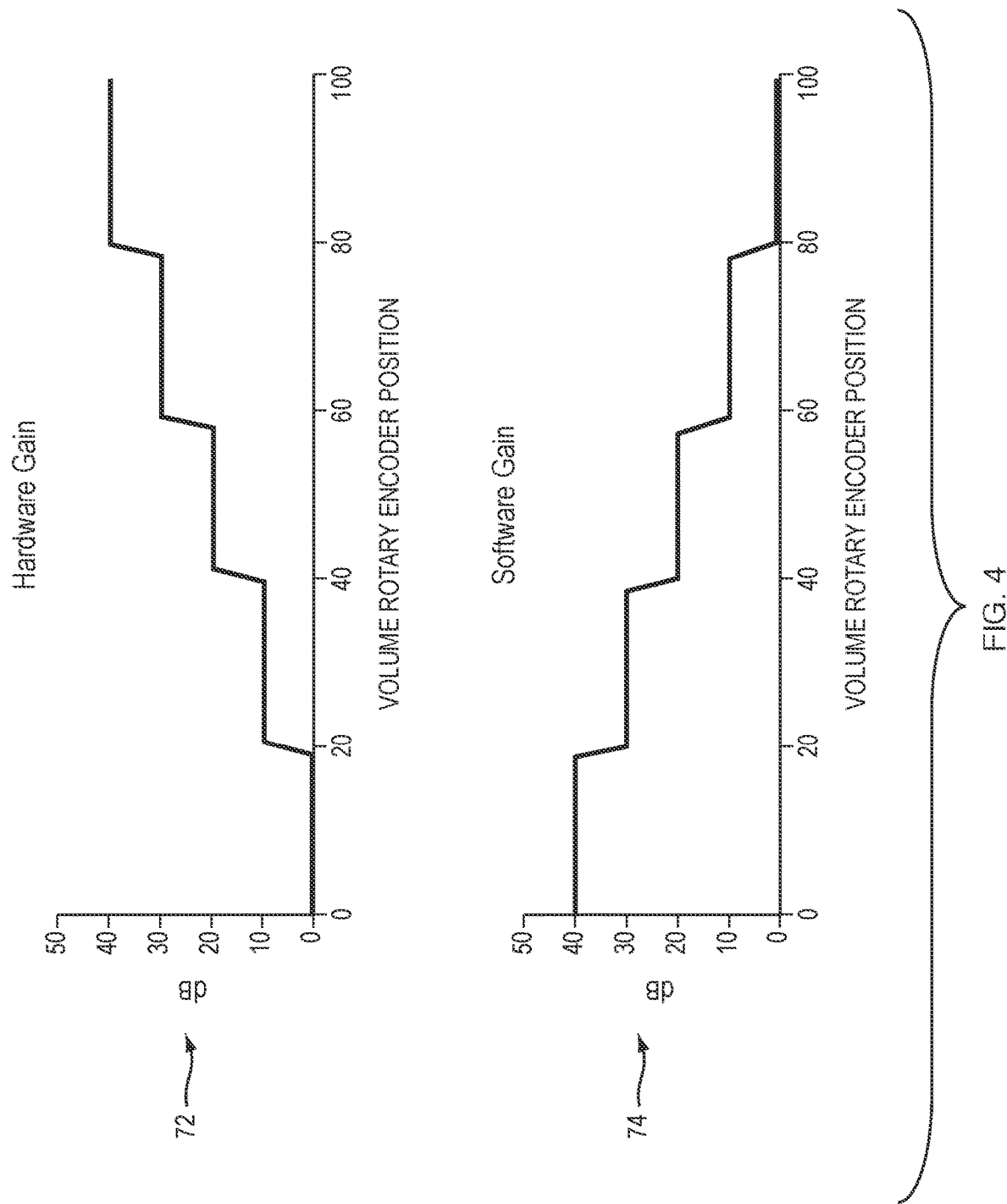
FIG. 4 illustrates gains that are applied in hardware and software for the audio signal amplifier of FIG. 3.

Functional aspects of amplifier 40 that are useful in understanding this disclosure are shown in FIG. 3. The audio input 50 is via any standard connector. In situations where the amplifier is used in musical performances, the amplifier commonly includes one or more input jacks. In some examples the input 50 is an XLR/TRS input jack. In some examples the input signal is an analog audio signal that is provided to pre-amp 52. A function of pre-amp 52 is to accomplish a first gain stage that is configured to adjust the gain of the signal in response to a volume selected by the user via physical control knob 42 or a virtual control 43 that is part of a mobile control app. In an example the gain adjustment is accomplished in a number of discrete gain steps. The resulting changes in gain are cumulative. In the illustrated, non-limiting example, pre-amp 52 includes four CMOS gain switches, each of which is configured to increase the gain by about 10 dB, as illustrated by curve 72, FIG. 4. In the illustrated examples there are five total gain states, from 0 to 40 dB. The gain that is enabled by pre-amp 52 is selected based on the position of the user control. In an example a physical or virtual control knob (such as those illustrated in FIGS. 2A and 2B) can be turned from 0 to 100, and each 20% increment of the knob results in a different gain state, as illustrated by curve 72. The buffered analog signal is then provided to analog-to-digital converter (ADC) 54, which converts the signal into the digital domain and provides it to digital signal processor (DSP) 56.

DSP 56 receives information on the intended channel volume from the system's microcontroller 44, by one of two methods. When the user turns the product's volume knob, the attached rotary encoder increases or decreases the volume setting that is stored in the microcontroller. When the user adjusts the volume control in the mobile application, commands are sent over Bluetooth to the microcontroller (via a Bluetooth interface) to increase or decrease the volume setting. With either method, the current volume level is shown to the user with a circular ring of LEDs around the knob on the product as shown in FIG. 2A, and with a similar indication in the mobile application UI as shown in FIG. 2B.

The volume control setting takes effect in hardware (in the analog front-end pre-amp 52, prior to the ADC 54) and in software (in the DSP 56). In some examples hardware gain control is done as a coarse adjustment (e.g., in four steps) using digitally-controlled analog (CMOS) switches to select feedback resistance in an op-amp gain circuit. Within each of these coarse steps, finer adjustments are made in the DSP to select the proper overall gain. By applying only a portion of the gain in the DSP, low-level signals can be amplified in the analog domain to avoid amplifying the ADC's noise floor and thus maintain the desired signal-to-noise ratio.

In some examples DSP 56 includes a non-transitory computer-readable medium that has computer program logic encoded thereon that is configured to accomplish the DSP functions described herein. Within the DSP, in some examples the overall volume control (i.e., the system gain) is represented as a continuous curve, mapped to the volume requested by the user. Prior to the application of that curve, a compensation gain is inserted that is the opposite of the analog gain. With the four-step analog gain example illustrated by curve 72, FIG. 4, the opposite compensation gain applied in the second amplifier stage accomplished by DSP 56 is illustrated by curve 74, which also has five total gain states, from 40 to 0 dB, accomplished over four discrete gain steps. In some examples the analog gain plus the compensation gain equals a constant non-zero value. By applying the opposite gain in the DSP, the total gain (in the analog and digital domains combined, and including the system gain) matches what is requested by the user. The digital output signal is converted to analog by D to A converter 58. The signal is then amplified by analog power amplifier 60 and provided to the loudspeaker(s).

The DSP controls the hardware (CMOS) gain applied by pre-amp 52 via general-purpose digital outputs that operate the analog switches, and thus the overall gain is under the control of the DSP. The overall gain is dependent on the position of the volume rotary encoder. However, this gain schedule may be automatically adjusted when louder signals are present at the analog input. This can prevent the ADC from saturating. The DSP has knowledge of the loudness of the input signal via measurement of the signal level at the input to the DSP. If the input signal is too loud such that the ADC might saturate, non-zero hardware gains may be stepped down (reduced) under control of the pre-amp by the DSP one step at a time, thus lowering the amplitude of the signal present at the input to the ADC. This scheme both allows maximum sampling bit-resolution and avoids clipping when the rotary encoder is set in a higher volume range. Additionally, if an automatic down-step adjustment is active and the audio signal amplitude decreases, the hardware/DSP gains will be returned to the schedule via the DSP based on the user interface, one step at a time, in spaced intervals. In an example the interval spacing is four seconds; this is done to avoid sudden large amplitude changes.

In some examples the transitions between the hardware gain steps and the subsequent DSP compensation gain are synchronized, to reduce transient artifacts (i.e., temporal misalignment of gain adjustments) that can result in noise. The time at which a simultaneous gain-step and its compensation occurs is called the "seam". There are multiple techniques that can be used alone or together to mitigate misalignment artifacts.

Latency compensation is one such technique to mitigate misalignment artifacts. Latency compensation accounts for the fixed time-delay that occurs (due to ADC latency) between a gain step-change request and the actual change in amplitude of the audio data passed to the DSP. In compensating for this delay, the temporal mismatch at the seam can be reduced to one sample. In an example of latency compensation, when the DSP directs the analog hardware to initiate a step-change in gain, it takes some time for the new value to manifest in the audio signal processed by the DSP. This is due to buffering of data in the analog/digital conversion hardware. As a result, the portion of the audio signal in need of processing occurs a short time (e.g., approximately 0.5 ms) after command initiation. This time can vary if other hardware is used. A simple delay block (e.g., of about 0.5 ms) in the DSP compensation/repair logic ensures that any required signal processing properly aligns with the subsequent change in the audio signal. In these examples the delay block time in the compensation/repair logic is matched to any latency introduced by the analog/digital conversion due to data buffering.

Figure 5A:
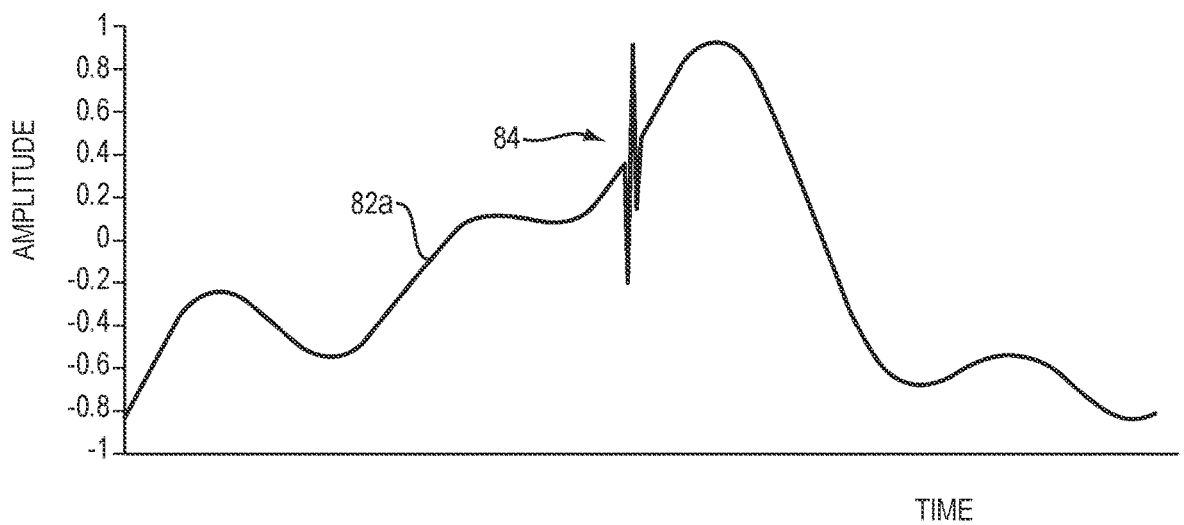
FIGS. 5A-5C illustrate steps in removing and replacing noise in an audio signal using the audio signal amplifier of FIG. 3.
Figure 5B:
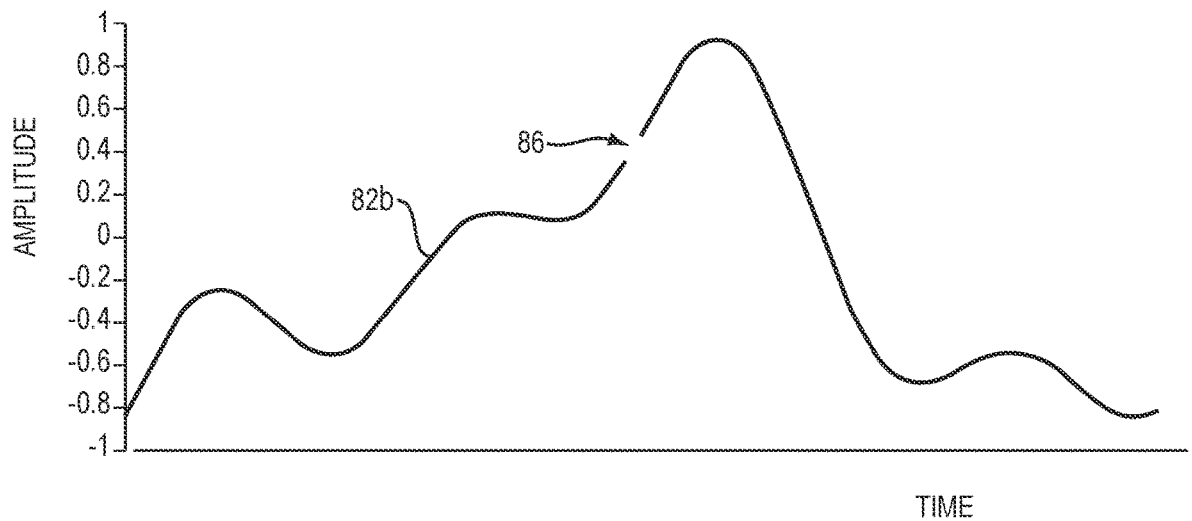
Figure 5C:
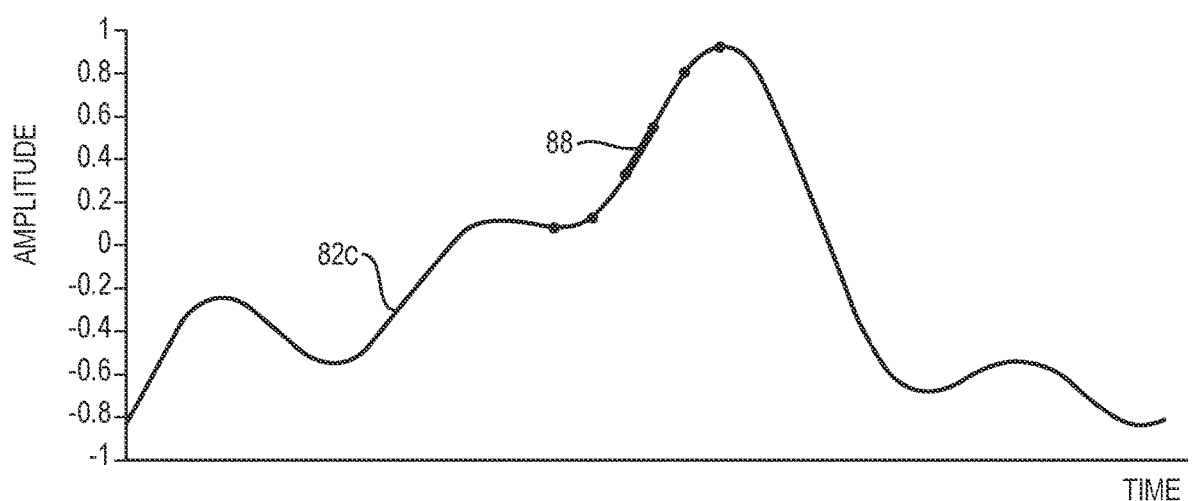

Even after ADC latency is compensated for, there are often slight, signal-dependent shifts in phase due to the pre-DSP hardware stages. These phase shifts can result in discontinuities that are heard as noise. An exemplary discontinuity 84 is illustrated in audio signal curve 82a, FIG. 5A. Because of the phase shifts, creating an inaudible seam can be difficult. Such misalignment artifacts can be mitigated using the following approach. See FIGS. 5B-5C.

In an example several samples (e.g., approximately 0.25 ms) of data are silenced (zeroed) in the audio data, centered around (i.e., before and after) the seam. The zeroed data is illustrated as gap 86 in curve 82b, FIG. 5B. The zeroed samples are reconstructed from the surrounding data to interpolate gap 86 and replace it with data 88 of curve 82c, FIG. 5C. In an example this reconstruction is accomplished using a network of 6th-order, windowed-sync, FIR filters. Data from both before and after the seam is used, so look-ahead is required. This adds a small virtually imperceptible amount of latency to the overall processing. In the illustrated example the data used is represented by the six dots on curve 82c, three before reconstructed data 88 and three after it.

Elements of figures are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawing.

Examples of the systems and methods described herein comprise computer components and computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

A number of implementations have been described. Nevertheless, it will be understood that additional modifications may be made without departing from the scope of the inventive concepts described herein, and, accordingly, other examples are within the scope of the following claims.

What is claimed is:

1. A system for controlling the gain of an input signal in an audio signal amplifier, comprising:
   a user-operable gain control;
   at least one analog circuit element comprising an analog pre-amplifier, and at least one digital circuit element comprising a digital signal processor (DSP) downstream of the pre-amplifier, wherein the analog and digital circuit elements together are configured to modify the gain of the input signal in response to the user-operable gain control; and
   wherein the at least one analog circuit element is configured to increase the gain of the input signal in each of a plurality of first discrete gain steps as the gain control is increased, the at least one digital circuit element is configured to decrease the gain of the input signal in each of a plurality of second discrete gain steps as the gain control is increased, such that the at least one digital circuit element gains compensate for the at least one analog circuit element gains, and the DSP is further configured to apply a system gain in addition to the compensation gain, wherein a total gain applied by the system and established by the user-operable gain control is based on a combination of the analog gain, the compensation gain, and the system gain.

2. The system of claim 1, wherein the quantity of first discrete gain steps is the same as the quantity of second discrete gain steps, and wherein the second compensation gain steps are the opposite of the first gain steps.

3. The system of claim 2, wherein an overall gain accomplished by the first gain steps and the second compensation gain steps together, is constant in each of the combined first and second discrete gain steps.

4. The system of claim 1, wherein the user-operable gain control is a continuous control.

5. The system of claim 1, wherein the user-operable gain control comprises a physical control member and a virtual control member, wherein the physical and virtual control members have matching appearances.

6. The system of claim 5, wherein the physical control member comprises a control knob and the virtual control member comprises a knob icon.

7. The system of claim 1, wherein the at least one analog circuit element is configured to reduce the gain of the input signal upon detection of a high input signal level.

8. The system of claim 7, wherein the at least one digital circuit element is configured to detect the high input signal level and select the gain reduction accomplished by the at least one analog circuit element.

9. The system of claim 1, wherein the at least one digital circuit element is further configured to compensate for a time delay between a gain change request and the actual change in amplitude of audio data.

10. The system of claim 1, wherein the at least one digital circuit element is further configured to remove and replace signal discontinuities in an output signal.

11. The system of claim 10, wherein the at least one digital circuit element is configured to remove and replace signal discontinuities by zeroing digital data that includes the discontinuity.

12. The system of claim 11, wherein the at least one digital circuit element is further configured to remove and replace signal discontinuities by reconstructing the zeroed digital data from surrounding data.

13. The system of claim 10, wherein the at least one digital circuit element is configured to remove and replace signal discontinuities by reconstructing digital data at the signal discontinuities from surrounding data.

14. The system of claim 1, wherein the modification of the gain of the input signal is under control of the at least one digital circuit element.

15. The system of claim 1, wherein an overall gain applied by both the at least one analog circuit element and the at least one digital circuit element together matches a target gain from the user-operable gain control.

16. A system for controlling the gain of an input signal in an audio signal amplifier, comprising:
    a user-operable gain control;
    an analog pre-amplifier that defines a plurality of first discrete gain steps that each accomplish different gains on an audio signal;
    a digital signal processor (DSP), downstream of the pre-amplifier, that is configured to define a plurality of second discrete compensation gain steps that are the opposite of the first gain steps, to compensate for the pre-amplifier gain, wherein the quantity of first discrete gain steps is the same as the quantity of second discrete gain steps, and wherein the DSP is further configured to apply a system gain in addition to the compensation gain;
    wherein an overall gain accomplished by the first gain steps and the second compensation gain steps together is constant in each of the combined first and second discrete gain steps; and
    wherein the analog and digital circuit elements together are configured to modify the gain of the input signal in response to the user-operable gain control.

17. The system of claim 16, wherein the at least one analog pre-amplifier is further configured to reduce the gain of the input signal upon detection of a high input signal level, the DSP is further configured to detect the high input signal level and select the gain reduction accomplished by the pre-amplifier, and the DSP is further configured to remove and replace signal discontinuities in an output signal by reconstructing digital data at the signal discontinuities from surrounding data.

* * * * *